(12) United States Patent
Kim (10) Patent No.: US 7,624,497 B2
(45) Date of Patent: Dec. 1, 2009

(54) COMPONENT RECOGNITION APPARATUS FOR CHIP MOUNTER

(75) Inventor: Sang-cheol Kim, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 29 days.

(21) Appl. No.: 11/825,715

(22) Filed: Jul. 9, 2007

(65) Prior Publication Data

US 2008/0083114 A1 Apr. 10, 2008

(30) Foreign Application Priority Data

Oct. 9, 2006 (KR) ...................... 10-2006-0098141

(51) Int. Cl.
*H05K 3/30* (2006.01)
(52) U.S. Cl. .............................. 29/721; 29/740; 29/741; 29/833
(58) Field of Classification Search ........... 29/740–743, 29/715, 719, 720–721, 832–834; 348/87, 348/345, 370; 382/148–152
See application file for complete search history.

(56) References Cited

U.S. PATENT DOCUMENTS

| 4,608,494 | A  | * | 8/1986 | Kobayashi et al. | ........ 250/461.1 |
| 6,342,916 | B1 | * | 1/2002 | Kashiwagi et al. | ............ 348/87 |
| 6,876,761 | B1 | * | 4/2005 | Okuda et al. | ................ 382/151 |
| 7,019,782 | B2 | * | 3/2006 | Engel | ......................... 348/345 |

* cited by examiner

*Primary Examiner*—Minh Trinh
(74) *Attorney, Agent, or Firm*—Drinker Biddle & Reath LLP (57) ABSTRACT

A component recognition apparatus for a chip mounter includes a head portion having a frame and at least one nozzle portion installed on the frame, the nozzle portion picking up an electronic component and mounting the electronic component on a substrate, a camera coupled with the frame and comprising an imaging device, and a mirror portion having a mirror support portion installed on the frame and a mirror held by the mirror support portion in a space that does not interfere with the movement path of the electronic component held by the nozzle portion. The camera includes a lens portion, and an image of the electronic component held by the nozzle portion is reflected by the mirror, passes off-axis through the lens portion, and is formed on the imaging device.

8 Claims, 9 Drawing Sheets

COMPONENT RECOGNITION APPARATUS FOR CHIP MOUNTER

CROSS-REFERENCE TO RELATED PATENT APPLICATIONS

This application claims the benefit of Korean Patent Application No. 10-2006-0098141, filed on Oct. 9, 2006, in the Korean Intellectual Property Office, the disclosure of which is incorporated herein in its entirety by reference.

BACKGROUND OF THE INVENTION

1. Field of the Invention

The present invention generally relates to chip mounters. More particularly, the present invention relates to a component recognition apparatus for a chip mounter.

2. Description of the Related Art

Chip mounters are used to mount components such as integrated circuit (IC) components, semiconductor packages, etc. on a substrate such as a printed circuit board (PCB). Recently, both PCBs and individual IC components have become complex and highly integrated. Accordingly, IC components mounted on PCBs have a large number of very closely spaced output pins.

Before an electronic component is mounted on a PCB it is picked up by a chip mounter and held by suction on a nozzle. To ensure accurate placement of the component on the PCB and proper alignment of connectors of the electronic component with traces of the PCB, the nozzle of the component mounter may rotate the component by an angle. To facilitate determination of the component angle, a component recognition apparatus is provided.

The component recognition apparatus is generally attached to the main body or the head of a chip mounter. In a conventional component recognition apparatus that is attached to the head of a chip mounter, a mirror is usually placed under an electronic component to reflect its image to a camera, so that the angular orientation of the electronic component can be recognized and, if necessary, subsequently corrected.

Figure 1:
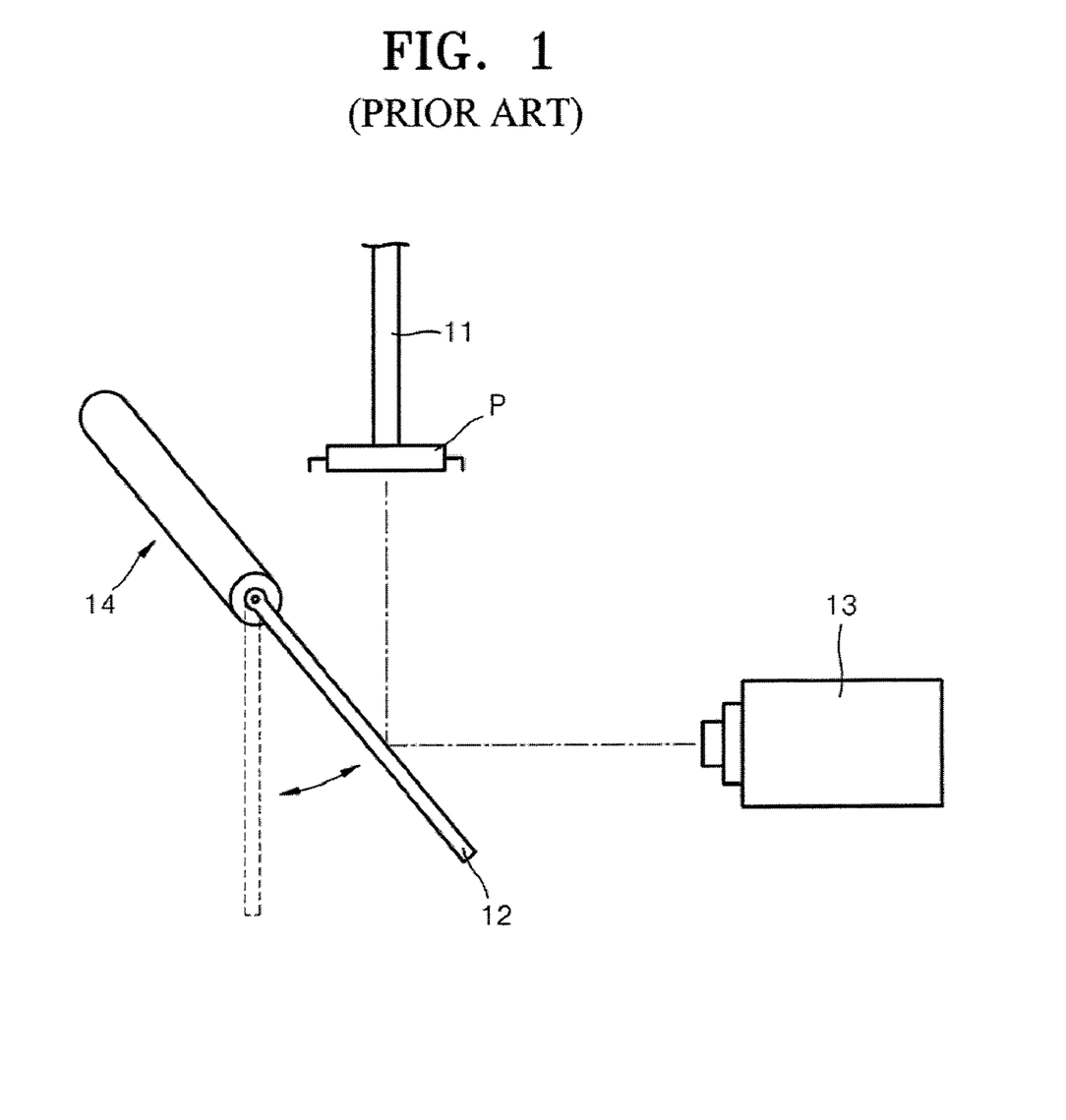
FIG. 1 shows a conventional head-attached component recognition apparatus.

FIG. 1 is a schematic view of the conventional head-attached component recognition apparatus. As shown in FIG. 1, the conventional component recognition apparatus includes a nozzle 11, a mirror 12, a camera 13, and a driving mechanism 14. The nozzle 11, mirror 12, camera 13, and driving mechanism 14 are all installed on a head (not shown) of a chip mounter. The mirror 12 is arranged directly under an electronic component P that is held by the nozzle 11.

An image of the electronic component P is reflected by the mirror 12 and input to the camera 13 along an optical axis. In this case, the mirror 12 is configured to rotate clockwise to avoid interference with the electronic component P when the nozzle 11 moves downward to pick up and mount the electronic component P. For this purpose, the driving mechanism 14 is installed in the head, which increases the weight of the head.

The increased weight of the head causes higher momentum when the head moves, and thus reduces the component mounting speed. Also, the position and angle of the mirror 12 need to be set accurately by the driving mechanism 14, otherwise the electronic component P to be mounted can be incorrectly recognized.

SUMMARY OF THE INVENTION

According to an aspect of the present invention, a component recognition apparatus for a chip mounter comprises a head portion, a camera and a mirror portion. The head portion includes a frame and at least one nozzle portion installed on the frame, the nozzle portion being configured to pick up an electronic component and mount the electronic component on a substrate. The camera, which includes a lens portion and an imaging device, may be installed on the frame. The mirror portion includes a mirror support portion installed on the frame and a mirror connected to the mirror support portion such that the mirror is configured in a space that does not interfere with a movement path of the nozzle portion. An image of the electronic component, which is picked up by the nozzle portion, is reflected by the mirror, passes off-axis through the lens portion, and is formed on the imaging device.

When the head portion includes more than one nozzle portions, the number of cameras may be greater than one. When the number of nozzle portions is greater than one, a single camera may be provided for sequentially recognizing the electronic component picked up by each nozzle portion. The single camera may move along the head portion.

DETAILED DESCRIPTION OF THE EMBODIMENTS

Figure 2:
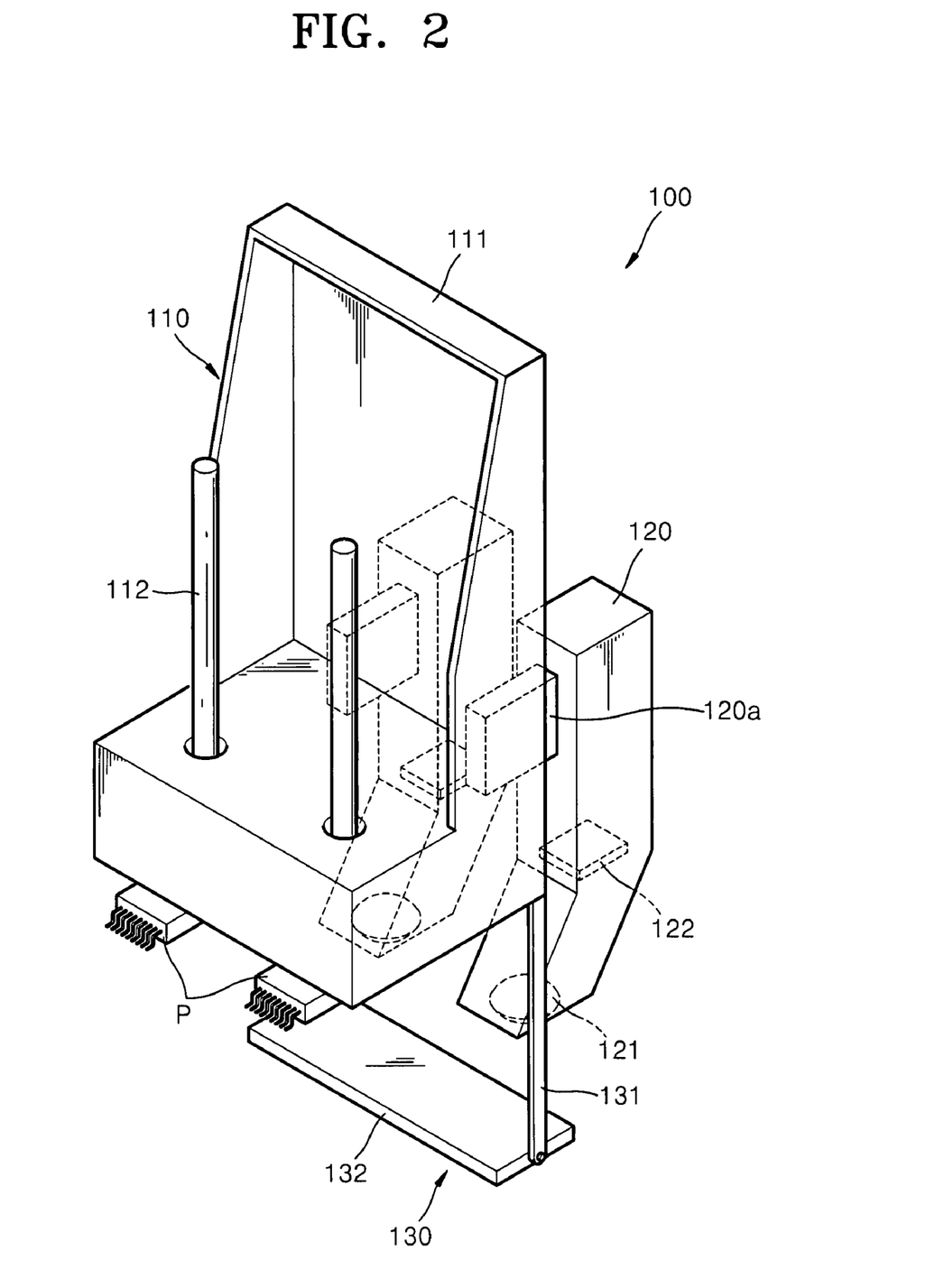
FIG. 2 is a perspective view of a component recognition apparatus according to an embodiment.

FIG. 2 is a perspective view of an embodiment of a component recognition apparatus. Referring to FIG. 2, a component recognition apparatus 100 for a chip mounter includes a head portion 110, a camera 120, and a mirror portion 130.

The head portion 110 includes a frame 111 and at least one nozzle portion 112 installed on the frame 111. The nozzle portion 112 is capable of picking up an electronic component P by suction. The frame 111 includes a generally horizontal base portion with at least one aperture in which the at least one nozzle portion 112 is configured for upward and downward movement as well as angular movement such as 360° rotation. The at least one aperture (e.g., two apertures as shown) are configured proximate to a first side (e.g., a front side as shown in FIG. 2) of the base portion. The frame 111 includes a generally vertical upper portion that extends upward from another edge or side (e.g., a rear side as shown in FIG. 2) of the base portion. As shown, the generally vertical upper portion is distal from the at least one aperture and the at least one nozzle portion 112. Although not illustrated in FIG. 2, the head portion 110 is equipped with a driving mechanism that moves the at least one nozzle portion 112 upward, downward and rotationally in the at least one aperture. As further shown, the camera 120 is connected to the generally vertical portion of the frame 111, more particularly to a surface thereof that faces away from the at least one nozzle portion 112. The mirror portion 130, as shown, is connected to the base portion of the frame 111 so that it is substantially underneath the generally vertical portion of the frame 111.

As shown in FIG. 2, two cameras 120 are installed and configured so that each camera 120 corresponds with each nozzle portion 112 of the at least one nozzle portion (e.g., two as shown). The camera 120 is mounted to the generally vertical portion of the frame 111 by a camera support portion 120a. The camera 120 extends downward from the support portion 120a past the base portion of the frame 111. A lower portion (e.g., a lens barrel) of the camera 120 extends downward and toward the mirror portion 130 at an angle with respect to the upper portion of the camera 120. The camera 120 detects a positional error of the electronic component P held by each nozzle portion 112. That is, when the nozzle portion 112 picks up a component P, the component P may be oriented so that the component P may be misaligned with traces of a PCB or leads of a lead frame if it were simply moved downward onto the target object such as a substrate. The camera 120 includes a lens portion 121 and an imaging device 122.

The lens portion 121 may include a wide-angle lens so as to receive a broad image of the electronic component P. The imaging device 122 is arranged above the lens portion 121 and may be an area charge coupled device (CCD). However, the imaging device 122 is not limited to the area CCD, and can also be a linear CCD.

In the present embodiment, the number of cameras 120 corresponds to the number of nozzle portions 112 in a 1:1 relationship, but the present invention is not limited thereto. That is, in other embodiments a single movable camera can be used to recognize electronic components P held by each nozzle portion 112 of a plurality of nozzle portions 112.

The mirror portion 130 includes a mirror support portion 131 and a mirror 132. The mirror support portion 131 is attached, connected or otherwise coupled at its upper end to the base portion of the frame 111 underneath the generally vertical portion of the frame 111. A lower portion of the mirror support portion 131 supports the mirror 132. The mirror 132 is held in a generally horizontal orientation by the mirror support portion 131. The mirror 132 is located in a space that does not interfere with a movement path of the electronic component P held by each nozzle portion 112. That is, the mirror 132 according to the present embodiment is arranged between the camera 120 and the nozzle portion 112 but not in the space directly under the nozzle portion 112. More particularly, the mirror 132 is configured underneath the generally vertical portion of the frame 111 such that the mirror 132 is distal from the nozzle portion 112.

The mirror 132 according to the present embodiment differs from the conventional technology shown in FIG. 1 in that the mirror 132 does not need to be moved to prevent interference with the electronic component P during, for example an electronic component pickup step, an electronic component recognition step, and an electronic component mounting step.

In the present embodiment, although only one mirror 132, which extends a width of the frame 111, is installed corresponding to a plurality of nozzle portions 112, the present invention is not limited thereto. That is, more than one mirror 132 may be provided. For example, a plurality of mirrors 132 can be configured such that each mirror 132 of the plurality corresponds in a 1:1 relationship with each nozzle portion 112 of a plurality of nozzle portions 112. In a step of recognizing the electronic component P, the camera 120 and the mirror portion 130 according to the present embodiment are arranged such that an image of the electronic component P is reflected by the mirror 132, passes through the lens portion 121, and is formed on the imaging device 122 in an off-axis method.

Figure 3A:
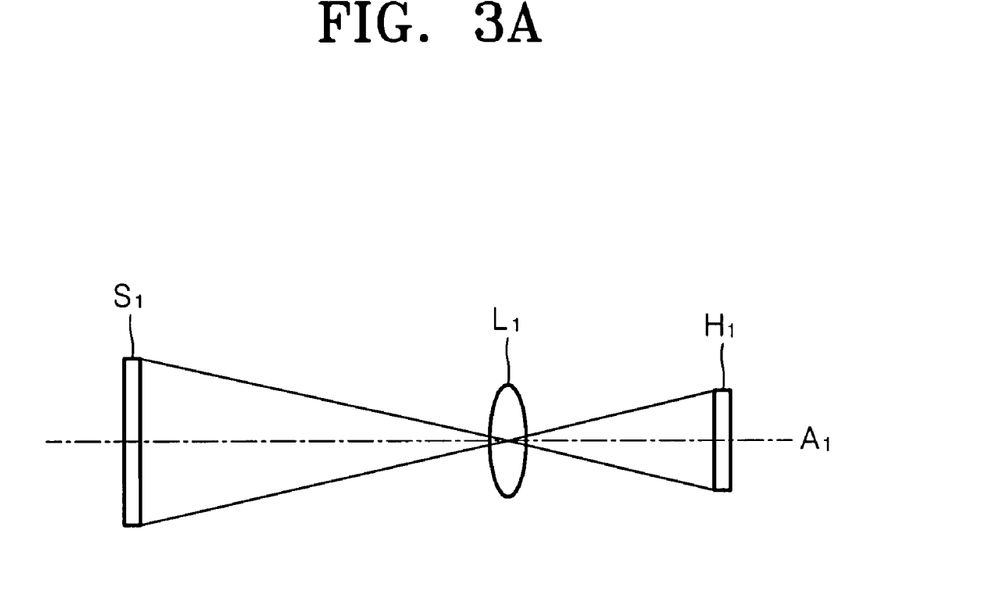
FIG. 3A shows an image of an object through a lens, the object being symmetrical with respect to the optical axis.
Figure 3B:
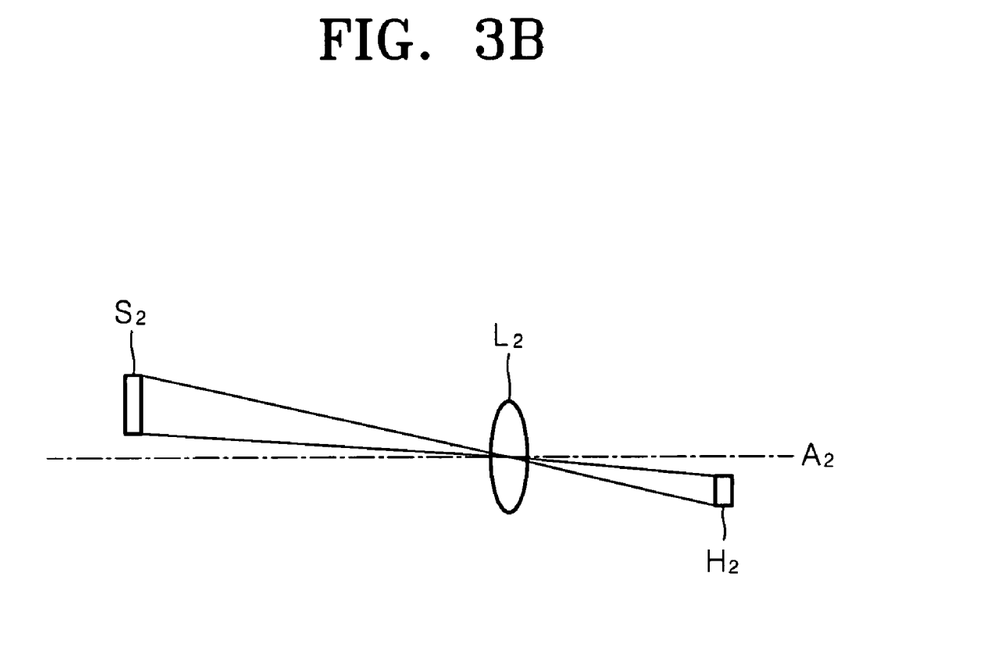
FIG. 3B shows an image of an object through a lens, the object being located off the optical axis.

The arrangement of the camera 120 and the mirror portion 130 according to the present embodiment will be described in detail with reference to FIGS. 3A through 5. FIG. 3A shows an image of an object through a lens, the object being symmetrically oriented with respect to an optical axis of the lens. FIG. 3B shows an image of an object through a lens, the object being oriented or located off the optical axis.

In a general optical system, as shown in FIG. 3A, an object $S_1$ is arranged to be symmetrical with respect to an optical axis $A_1$ so that an image $H_1$ that is formed by a lens $L_1$ is symmetrical with respect to the optical axis $A_1$. However, as shown in FIG. 3B, when an object $S_2$ is placed off an optical axis $A_2$ (or the lens $L_2$ is oriented such that its optical axis $A_2$ is not aligned with the object $S_2$) image $H_2$ that is formed by a lens $L_2$ off the optical axis $A_2$. This image forming method is referred to as an off-axis method, and is applied to a component recognition apparatus according to the present embodiment.

Figure 4:
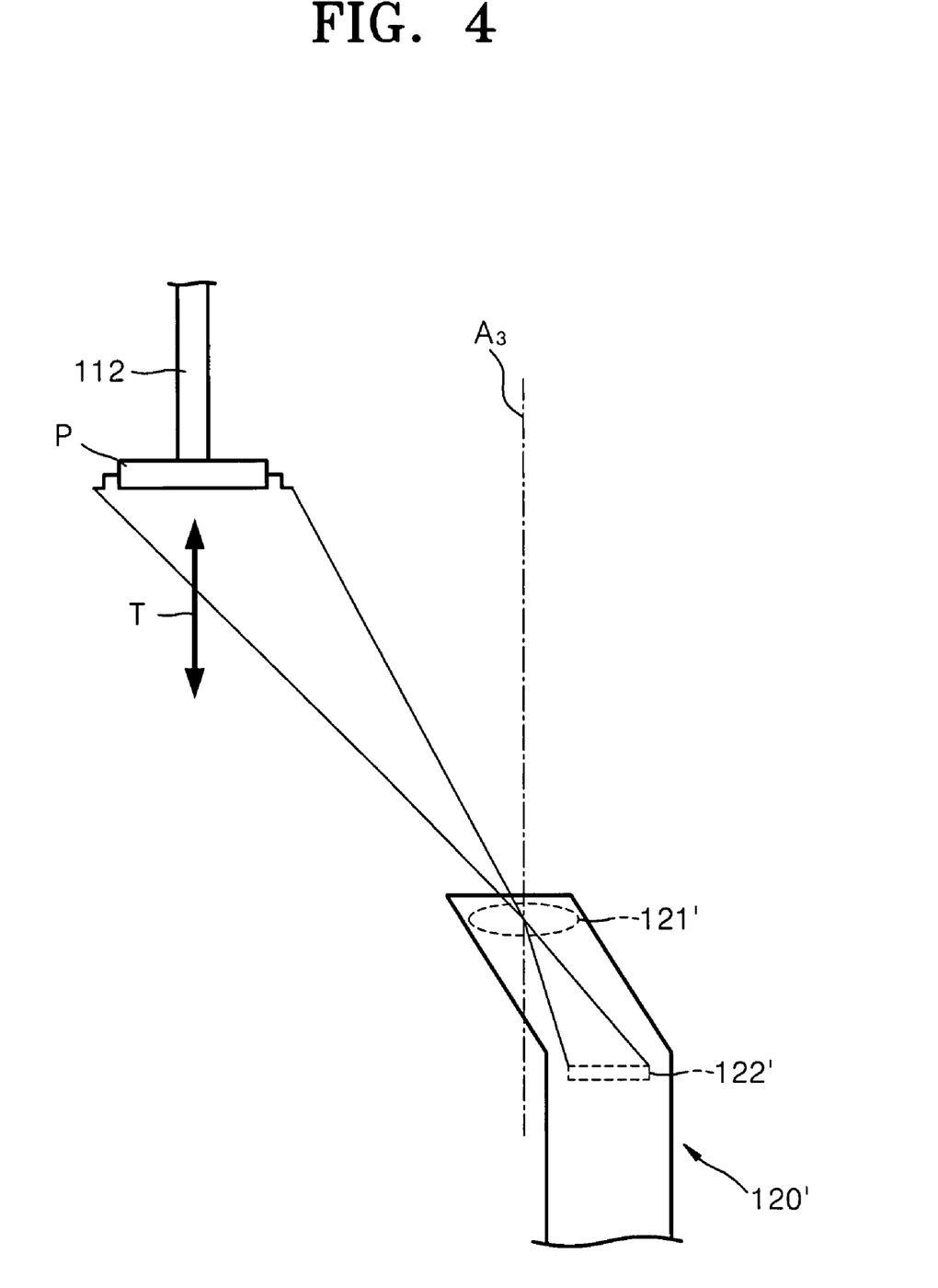
FIG. 4 shows a component recognition apparatus adopting an off-axis method.
Figure 5:
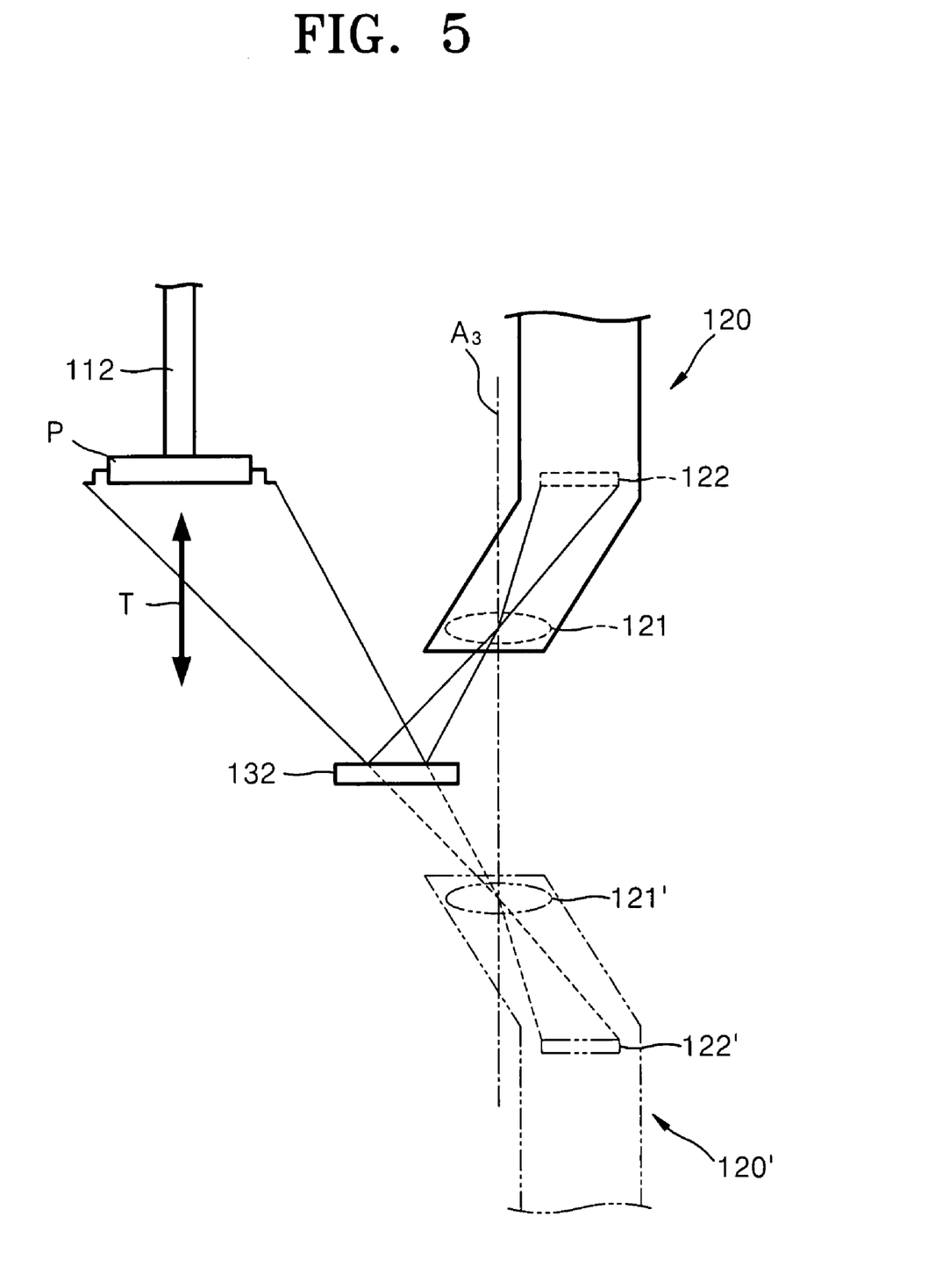
FIG. 5 shows a component recognition apparatus adopting a mirror-image, off-axis method.

FIG. 4 shows a component recognition apparatus adopting an off-axis method. FIG. 5 shows a component recognition apparatus adopting the off-axis method using a mirror portion.

As shown in FIG. 4, an optical axis $A_3$ extends upward from the center of a lens 121' of a camera 120' such that the optical axis $A_3$ is substantially parallel with the nozzle portion 112. An image of the electronic component P being held by the nozzle portion 112 passes through the lens portion 121' and is focused onto an imaging device 122' of the camera 120', not symmetrical to the optical axis $A_3$. Since the positions of the electronic component P is not symmetrical with respect to the optical axis $A_3$, and the image formed on the imaging device 122' is not symmetrical with respect to the optical axis $A_3$, this focusing method is an off-axis method.

However, since the camera 120' is arranged under the head portion near a component supply apparatus or a printed circuit board where the electronic component P is to be mounted, the component recognition apparatus of FIG. 4 limits the use of space and prevents efficient work. Accordingly, a mirror may be introduced so that the camera 120' may be relocated to a more convenient location.

As shown in FIG. 5, the mirror 132 is arranged on the path of the image shown in FIG. 4 to reflect the image of the component P upwards. Thus, the camera 120 can be installed in the upper part of the head portion 110. As a result, the mirror-image, off-axis method is used so that the camera 120 is arranged so as not to interfere with the component supply apparatus or printed circuit board, and efficient work is possible.

Also, when the off-axis method using the mirror 132 is used, since the mirror 132 does not need to be placed directly under the nozzle portion 112, and does not interfere with the movement path T of the electronic component P, the head portion 110 does not need to include the driving mechanism 14 used in the conventional component recognition apparatus of FIG. 1. Therefore, the weight of the head can be decreased, and the component mounting speed can be improved.

Figure 6:
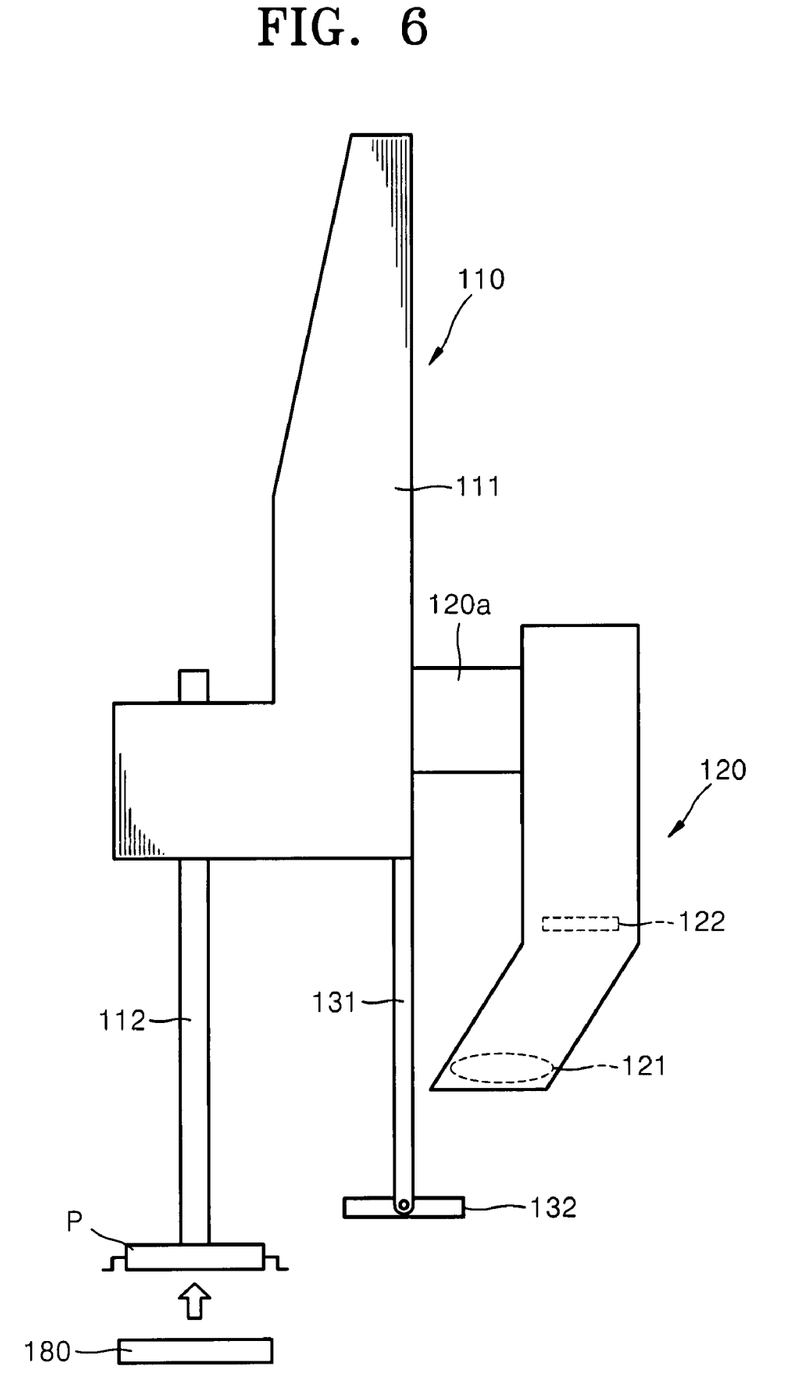
FIG. 6 is a side view of the component recognition apparatus of FIG. 2 showing a nozzle portion picking up an electronic component from a component supply apparatus.
Figure 7:
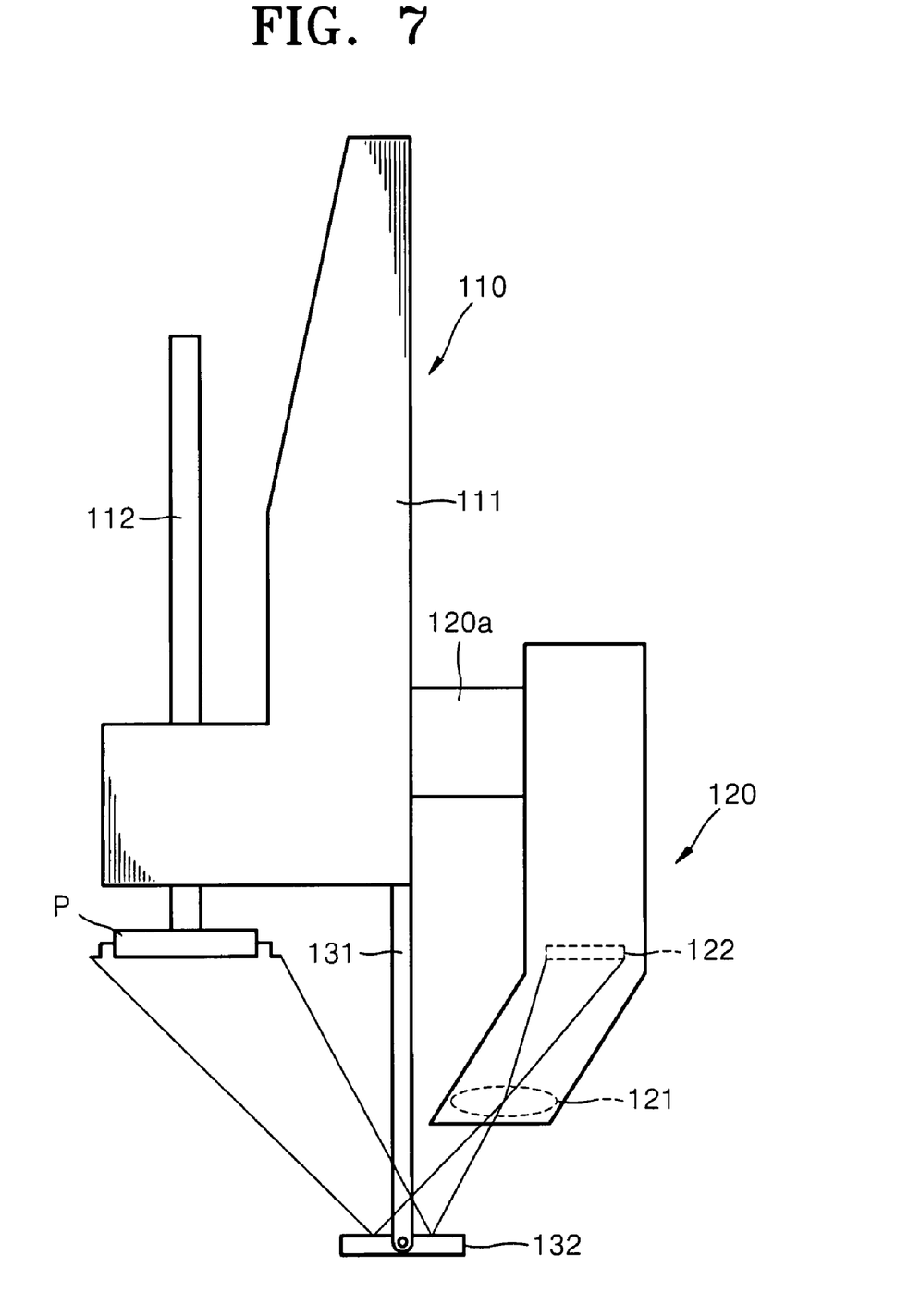
FIG. 7 is a side view of the component recognition apparatus of FIG. 2 showing the nozzle portion positioned in the component recognition position and an operation of recognizing the electronic component.
Figure 8:
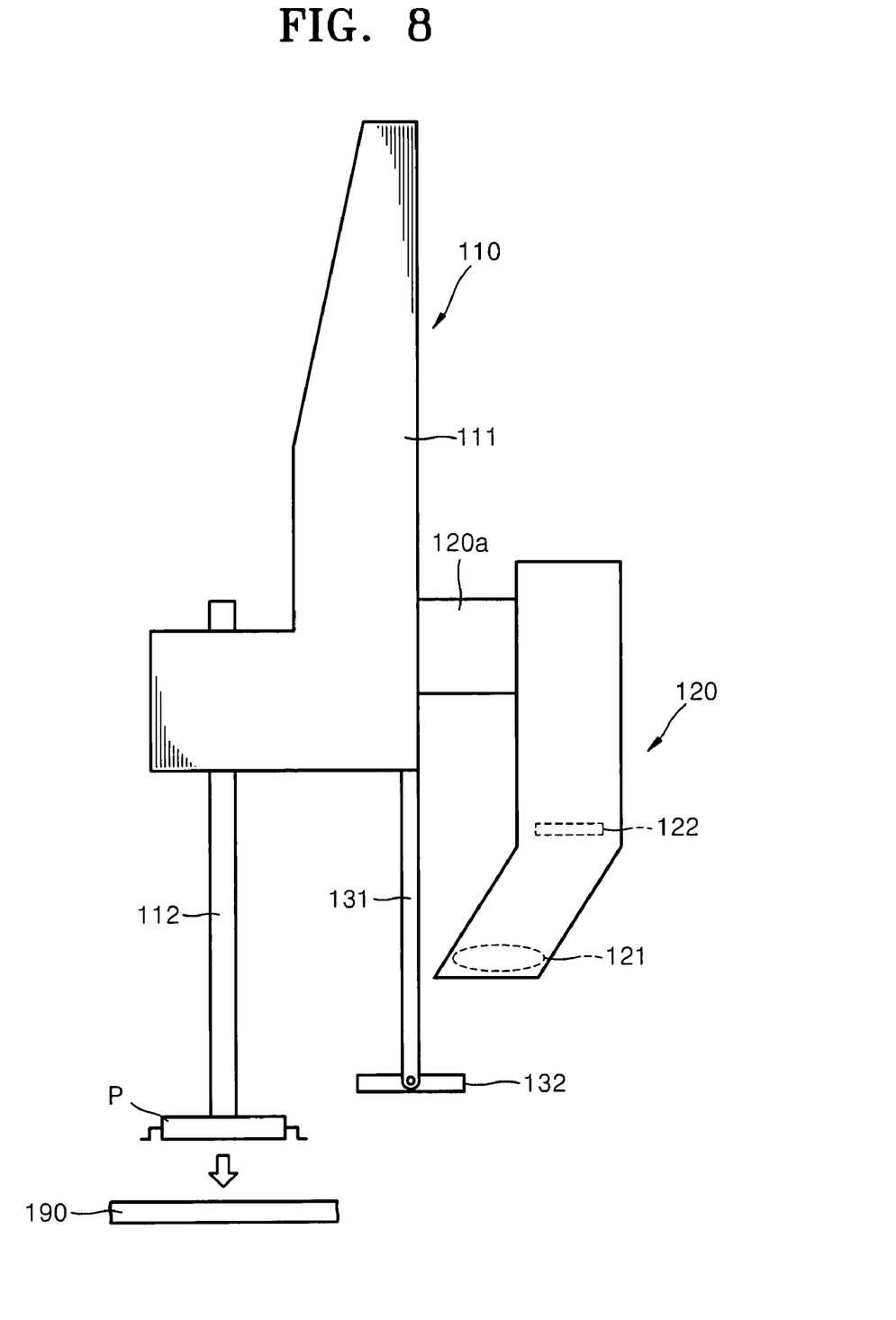
FIG. 8 is a side view of the component recognition apparatus of FIG. 2 showing moving the nozzle portion to a mounting position to mount the electronic component on a substrate.

The operation of the component recognition apparatus 100 for a chip mounter according to the present embodiment will be described with reference to FIGS. 6 through 8. FIG. 6 is a first side view showing a nozzle portion picking up an electronic component from a component supply apparatus and moving to a component recognition position. FIG. 7 is a second side view showing the nozzle portion at the component recognition position and showing the camera and mirror portion cooperating for recognition of the electronic component. FIG. 8 is a third side view showing the nozzle portion moving to a mounting position after recognition and, if necessary, orientation correcting, to mount the electronic component on a substrate or other target object such as a lead frame.

Referring to FIG. 6, the nozzle portion 112 descends from frame 111 to pick up the electronic component P supplied by a component supply apparatus 180 (e.g., a tape feeder). The nozzle portion 112 then ascends (as indicated by an arrow), holding the electronic component P. The mirror 132 is distal from the nozzle portion 112 and, therefore, does not interfere with the electronic component P during the descending and ascending steps.

Next, when the nozzle portion 112 ascends to a component recognition position, as shown in FIG. 7, the image of the electronic component P is reflected by the mirror 132 and formed on the imaging device 122 through the lens portion 121, by the off-axis imaging method. Then, the camera 120 recognizes the electronic component P so that the alignment and centering of the electronic component P can be recognized.

After the position of the electronic component P is recognized, the alignment of the electronic component P is adjusted or corrected, for example, by rotating the nozzle portion 112 by a predetermined angle. Then, as shown in FIG. 8, the nozzle portion 112 descends in the direction indicated by an arrow to mount the electronic component P on a substrate 190. Since the mirror 132 does not interfere with the electronic component P in the descending step, the electronic component P can be reliably and accurately mounted on the substrate 190.

As described above, the component recognition apparatus 100 for a chip mounter according to an embodiment of the present invention which adopts the off-axis method using the mirror 132 does not need an additional driving mechanism for driving the mirror 132, since the mirror 132 is fixed at a position that does not interfere with the movement of the electronic component P. Thus, manufacturing costs are reduced and the mounting of the electronic component P is performed accurately and rapidly.

Figure 9:
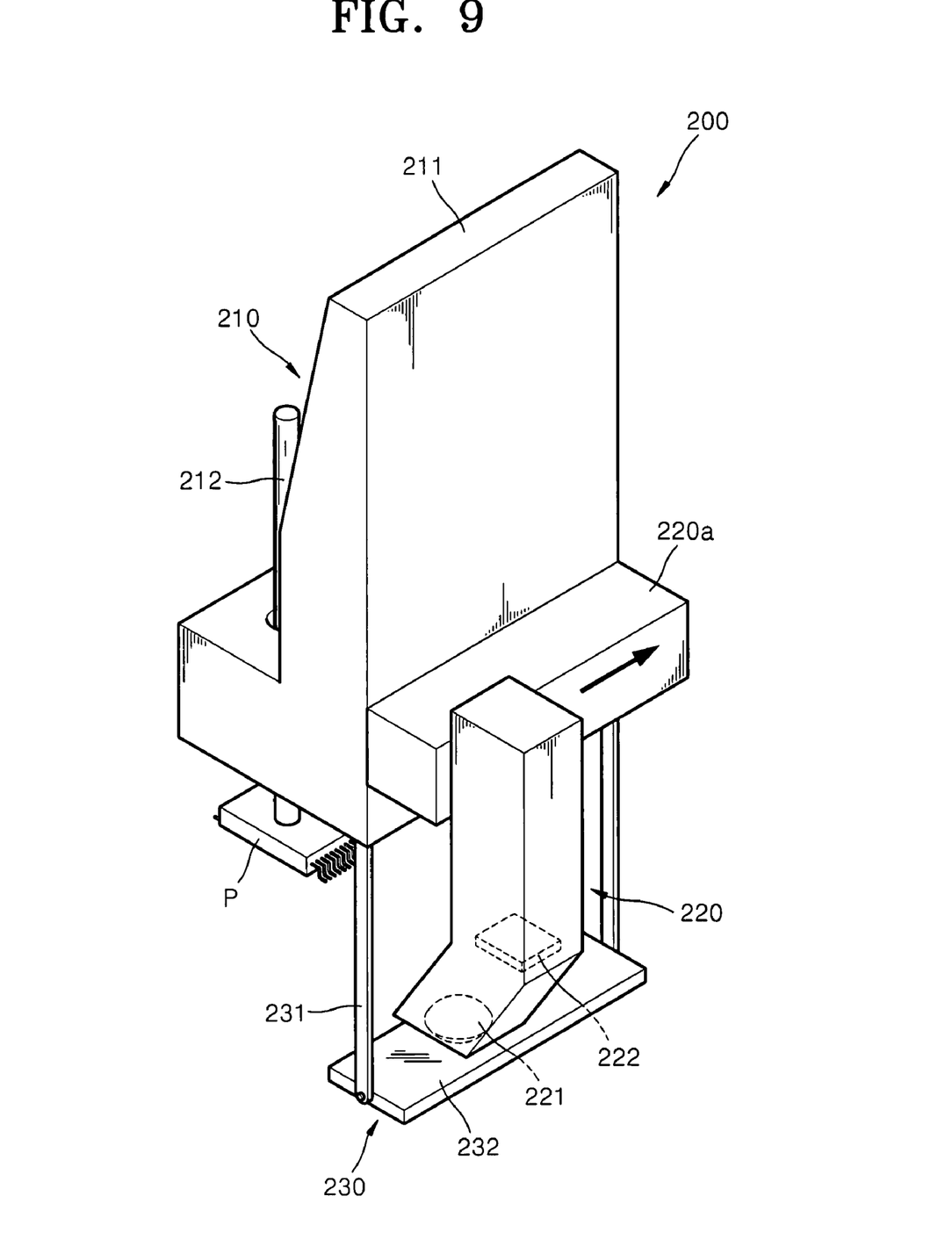
FIG. 9 is a perspective view of a component recognition apparatus according to another embodiment.

A component recognition apparatus according to another embodiment will now be described with reference to FIG. 9. FIG. 9 is a perspective view of a component recognition apparatus according to another embodiment of the present invention.

Referring to FIG. 9, a component recognition apparatus 200 according to another embodiment includes a head portion 210, a camera 220, and a mirror portion 230. The head portion 210 includes a frame 211 and a plurality of nozzle portions 212 installed on the frame 211. The frame 211 may be substantially similar to frame 111 of the previously-described embodiment and may be equipped with a driving mechanism which enables ascent, descent, and rotation of each of the nozzle portions 212. The camera 220 and the mirror portion 230 are respectively installed on one side of the base portion of the frame 211 and extend therebelow. Each nozzle portion 212 is capable of picking up an electronic component P by suction.

The camera 220 is installed at the side of the frame 211 by a camera support portion 220a. The camera support portion 220a extends substantially an entire width of the generally vertical upper portion of the frame 211. The camera 220 is configured to move along the length of the camera support portion 220a so that the camera 220 can be oriented in one or more locations relative to (e.g., substantially aligned with) the locations of one or more of the nozzle portions 212. The camera 220 detects a positional error of the electronic component P held by the nozzle portion 212. The present embodiment of the present invention uses one camera 220 since it is capable of sliding along the camera support portion 220a. That is, the camera 220 can move in a direction that is generally perpendicular to the direction in which the nozzle portion 212 extends.

The camera 220 may be substantially similar to camera 120 of the first embodiment. The camera 220 includes a lens portion 221 and an imaging device 222. The lens portion 221 may include a wide-angle lens so as to receive a broad image of the electronic component P. The imaging device 222 is arranged above the lens portion 221 and may use a linear charge coupled device (CCD). Thus, the camera 220 recognizes the electronic component P held by each nozzle portion 212 by line scanning while moving along the camera support portion 220a.

The mirror portion 230 may be substantially similar to the mirror portion 130 of the first embodiment. The mirror portion 230 includes a mirror support portion 231 and a mirror 232. The mirror 232 is fixedly installed by the mirror support portion 231. The mirror support portion 231 is fixed to a lower portion of the frame 211 and supports the mirror 232 in a generally horizontal orientation. The mirror 232 is arranged between the camera 220 and the nozzle portion 212 so as not to interfere with the movement path of the electronic component P held by the nozzle portion 212.

In the present embodiment, like the previous embodiment, the camera 220 and the mirror portion 230 are arranged such that an image of the electronic component P is reflected by the mirror 232, passes through the lens portion 221, and is formed on the imaging device 222 in the off-axis method, in the electronic component recognition step.

As described above, the component recognition apparatus 200 according to another embodiment of the present invention which adopts the off-axis method using the mirror 232 does not need an additional driving mechanism for driving the mirror 232, since the mirror 232 is fixed at a position that does not interfere with the movement path of the electronic component P. Thus, manufacturing costs are reduced and the mounting of the electronic component P may be performed accurately and rapidly.

Also, the component recognition apparatus 200 according to another embodiment of the present invention uses a single camera 220 for a plurality of nozzle portions 212, thus reducing the cost of installing the camera 220 and the overall weight of the head portion 210.

The structure, operation, and effect of the component recognition apparatus 200 are substantially similar as those of the component recognition apparatus 100. Thus, detailed description of the common aspects is not repeated for brevity.

As described above, according to the present invention, the manufacturing cost of a chip mounter is reduced, and accurate and rapid mounting of electronic components is possible, so that the efficiency of the chip mounter is improved.

While this invention has been particularly shown and described with reference to preferred embodiments thereof, it will be understood by those skilled in the art that various changes in form and detail may be made therein without departing from the spirit and scope of the invention as defined by the appended claims.

What is claimed is:

1. A component recognition apparatus for a chip mounter, the apparatus comprising:
    a head portion frame including a generally horizontal portion having a first edge, a second edge generally parallel with and distal from the first edge, at least one aperture proximate to the first edge, and a generally vertical portion extending upward from the second edge;
    at least one nozzle portion configured in the at least one aperture for upward, downward and rotational movement, the nozzle portion being configured to pick up an electronic component and mount the electronic component on a substrate;
    a camera including a first portion coupled with the generally vertical portion, and a second portion extending downward from the first portion and toward the first edge;
    a generally vertical mirror support extending downward from the generally horizontal portion proximate to the second edge; and
    a mirror at a lower end of the generally vertical mirror support, the mirror having a generally horizontal plane reflecting surface for reflecting an image of the electronic component to the camera when the nozzle portion is in an upward orientation;
    wherein the camera comprises:
        an imaging device; and
        a lens portion configured to receive the image of the electronic component that is reflected from the mirror and focus said image on the imaging device,
        wherein said image passes off-axis through the lens portion to the imaging device.

2. The apparatus of claim 1 wherein the camera comprises an area CCD.

3. The apparatus of claim 1 wherein the camera comprises a linear CCD.

4. The apparatus of claim 1 wherein the camera comprises a wide-angle lens.

5. The apparatus of claim 1 wherein the at least one nozzle portion includes two nozzle portions configured in a side-by-side arrangement that is generally parallel to the first edge.

6. The apparatus of claim 5 further comprising a second camera, wherein each camera is substantially aligned with a respective nozzle portion of the two nozzle portions.

7. The apparatus of claim 5 further comprising an actuator configured to move the camera along a width of the generally vertical portion for sequentially recognizing electronic components picked up by each nozzle portion of the two nozzle portions.

8. The apparatus of claim 5 further comprising a second mirror, wherein each mirror is substantially aligned with a respective nozzle portion of the two nozzle portions.

* * * * *